United States Patent [19]

Koyama

[11] Patent Number: 4,531,191

[45] Date of Patent: Jul. 23, 1985

[54] ELECTRON BEAM PATTERN GENERATION SYSTEM

[75] Inventor: Kiyomi Koyama, Yokohama, Japan

[73] Assignee: Tokyo Shibaura Denki Kabushiki Kaisha, Kawasaki, Japan

[21] Appl. No.: 334,913

[22] Filed: Dec. 28, 1981

[30] Foreign Application Priority Data

Dec. 26, 1980 [JP] Japan ................. 55-185926

[51] Int. Cl.³ ............................................. G06F 15/40
[52] U.S. Cl. .................................. 364/491; 250/492.2; 364/518
[58] Field of Search ....................... 364/491, 518, 490; 430/296; 358/261; 250/400, 492.2

[56] References Cited

U.S. PATENT DOCUMENTS

| 4,056,828 | 11/1977 | Furuta | 358/261 X |
| 4,151,421 | 4/1979 | Sumi | 250/492.2 |
| 4,280,186 | 7/1981 | Hidai et al. | 364/518 |
| 4,387,433 | 6/1983 | Cardenia et al. | 364/491 |
| 4,433,384 | 2/1984 | Berrian et al. | 364/490 X |

OTHER PUBLICATIONS

Journal of Vacuum Science and Technology; vol. 15, No. 3, 1978, pp. 874–877, A. M. Patlach et al.

Primary Examiner—Errol A. Krass
Assistant Examiner—Edward R. Cosimono
Attorney, Agent, or Firm—Oblon, Fisher, Spivak, McClelland & Maier

[57] ABSTRACT

Bit pattern data stored in an external memory unit is read out under the control of a microprocessor for being compressed in a data compressing unit and then stacked in a memory unit. At the time of storing data in the memory unit, all the stripe data constituting one chip frame are written in a state capable of being made high speed sequentially accessible at the time of the read-out without need of dividing a memory bank into portions for the individual stripes but by continuously using the address space covering the entire memory areas. This is effected by a memory management unit and a memory module management unit provided in the memory unit.

6 Claims, 18 Drawing Figures

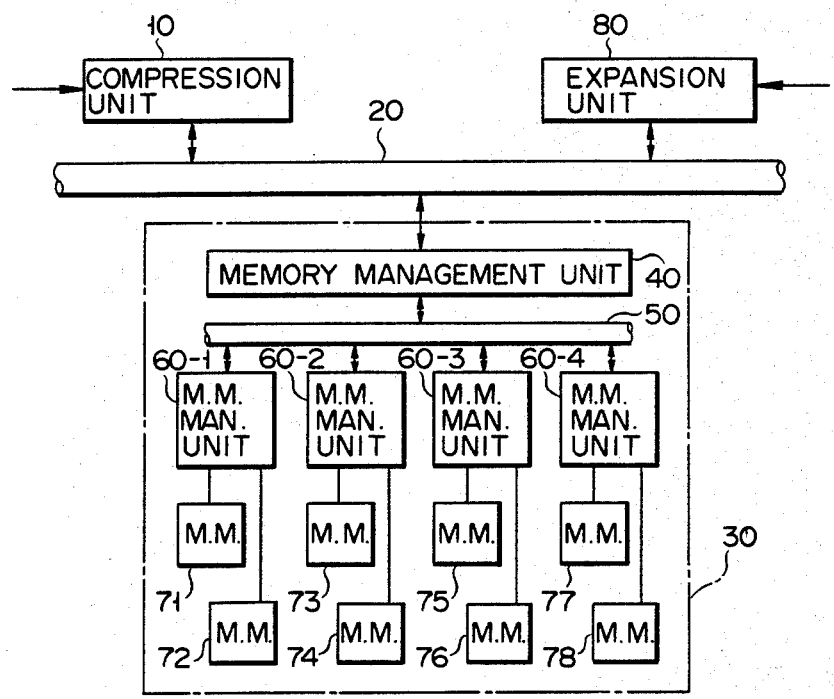

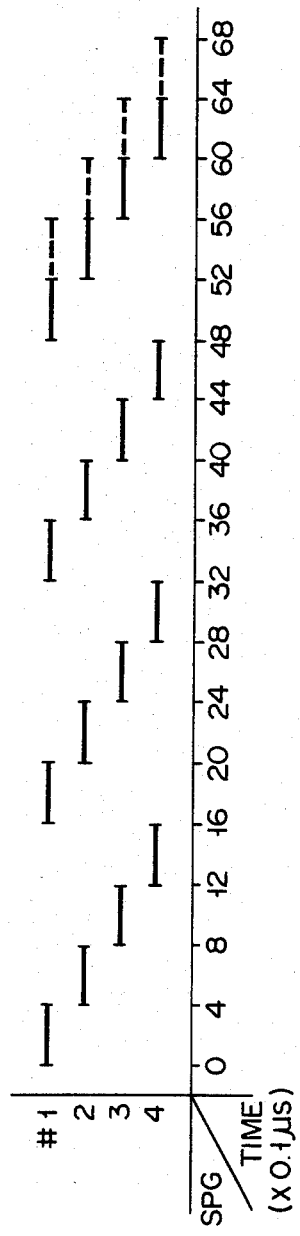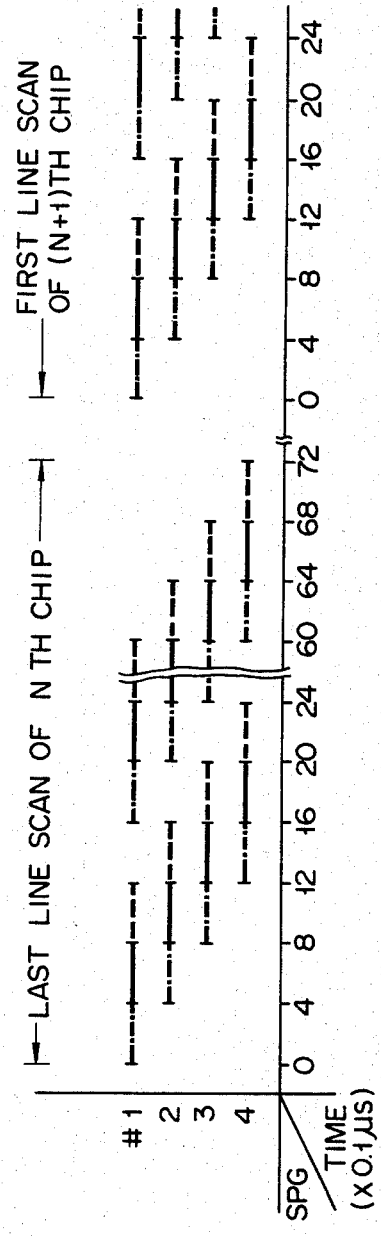

ELECTRON BEAM PATTERN GENERATION SYSTEM

BACKGROUND OF THE INVENTION

This invention relates to electron beam pattern generation systems used for forming a plurality of semiconductor device chips on a semiconductor wafer.

In the manufacture of a semiconductor device, use has been made of an electron beam pattern generation system for forming, for instance, an impurity diffusion mask pattern on a chip by using a resist. More particularly, the electron beam pattern generation system is used for drawing an exposure pattern on a resist coating on a semiconductor wafer with an electron beam emitted from an electron beam source by causing deflection of the electron beam according to pattern data. The exposure pattern is a dot pattern consisting of white and black dots. When a positive type resist is used, the white dots are formed in positions which are struck by the electron beam and the black dots in positions which are not struck by the beam. For on-off controlling the electron beam in accordance with the white and black dots, the pattern data is converted into digital or bit data consisting of bits of "1"s and "0"s before being supplied to the electron beam pattern generation system. The digital pattern data or bit pattern data is supplied from an external data source to a temporary storage unit and stored therein, and then it is read out and transferred to the electron beam pattern generation system under the control of an electronic computer. However, the bit pattern data consists of an enormous quantity of bits. For example, where a pattern with a bit density of 1 micron per bit is formed on an 8 mm×8 mm chip, a storage capacity of about 8 megabytes is required, and the storage capacity has to be increased to 32 and 128 megabytes when the bit density is increased to 0.5 and 0.25 micron per bit respectively. Usually, a plurality of chips are formed on a circular wafer, for instance with a diameter of 15 cm, and an extremely great storage capacity is necessary to be able to store digital pattern data for obtaining the exposure of the entire wafer with an electron beam.

The drawing speed of the electron beam pattern generation system is increasing year after year, whereas the speed of reading out pattern data from the storage unit is not keeping pace with the drawing speed increase. Therefore, limitations are imposed upon the upper limit of the speed of operation of the electron beam pattern generation system.

SUMMARY OF THE INVENTION

An object of the invention is to provide an electron beam pattern generation system, which can permit the writing and reading of high density bit pattern data at high speed with respect to a storage unit.

According to the invention, this object is achieved by an electron beam pattern generation system, which comprises an electron beam projection system including an electron beam source, a beam deflection unit operatively coupled to the electron beam source and a sample stage for supporting a sample to be exposed to the electron beam emitted from the electron beam source and moved relative to the electron beam source in perpendicular x- and y-directions in a plane perpendicular to the electron beam, means for continuously moving the sample stage relative to the electron beam source in a direction perpendicular to the direction of deflection of the electron beam and means for on-off controlling the electron beam from the electron beam source according to bit pattern data, said sample consisting of a plurality of chips arranged in the x- and y-directions, each of said chips consisting of a plurality of chip frames each having a width determined by the electron beam deflection range and a length in the direction of the relative movement of the stage, each of said chip frames consisting of a plurality of stripe regions each having the same length as the chip frame in the relative movement of the stage and a width equal to the division of the chip frame width in the perpendicular electron beam deflection direction by the number of the stripe regions of the chip frame, said electron beam pattern generation system including means for compressing bit pattern data for each stripe region, a memory bank for storing the compressed stripe data, storage means for writing, at the time of storing the compressed stripe data in the memory bank, all the compressed stripe data in a form capable of being made high speed sequential access to at the time of the read-out without need of dividing the memory bank into portions corresponding to the individual stripe regions but by continuously using the address space covering the entire memory areas, and means for expanding the stored compressed stripe data into bit pattern data consisting of "1"s and "0"s used as blanking data for on-off controlling the electron beam.

BRIEF DESCRIPTION OF THE DRAWINGS

FIG. 4 is a view showing compressed bit pattern data of one chip frame shown in FIG. 3 stored in memory modules in the same embodiment;

FIG. 5 is a detailed block diagram showing a memory unit shown in FIG. 1;

FIGS. 15 and 16 are timing charts illustrating the operation of the data expansion unit.

DETAILED DESCRIPTION OF THE PREFERRED EMBODIMENTS

Figure 1:
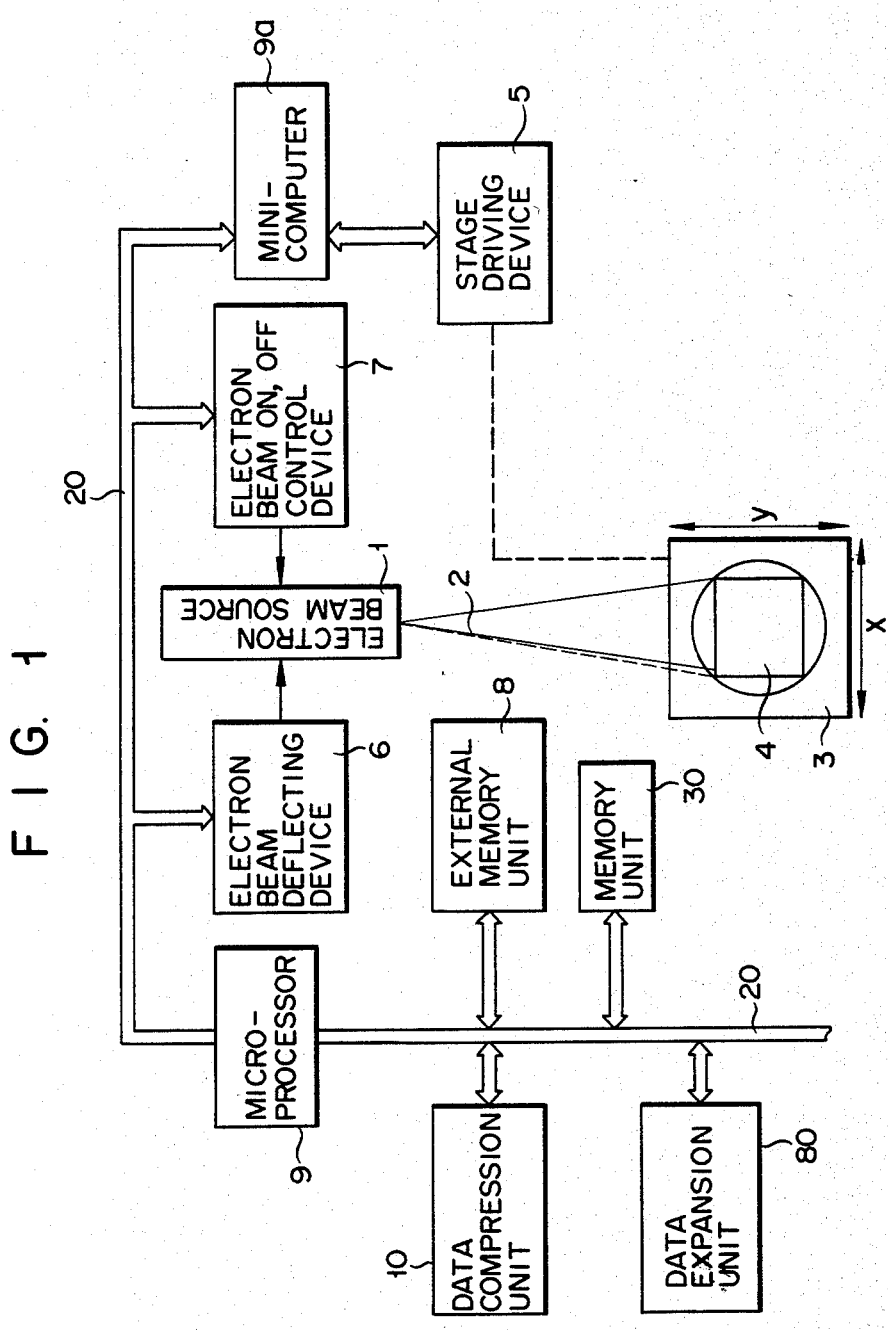
FIG. 1 is a block diagram showing one embodiment of the invention.

Referring to FIG. 1, an electron beam 2 emitted from an electron beam source 1 is projected onto a sample, for instance a semiconductor wafer 4, placed on a sample stage 3. The stage 3 is moved at a constant speed relative to the electron beam source 1 and in y-direction and in x-direction intermittently as will be described later. The electron beam 2 from the electron beam source 1 can thus strike every position of the semiconductor wafer 4. Meanwhile, the electron beam 2 is repeatedly deflected by a slight amount in the x-direction by an electron beam deflecting device 6. For example, the deflection width is set to 256$\mu$, and the diameter of the electron beam 2 is set to 1$\mu$. In this embodiment, the beam scan is effected by causing the beam 2 to make repetitive scanning over a width of 256$\mu$ in the x-direction with the stage 3 set in a predetermined x position while the stage 3 is moved in the y-direction continuously and at a constant speed. The semiconductor wafer 4 is coated with electron beam sensitive resists coating, and the electron beam 2 is on-off controlled by an electron beam on-off control device according to bit pattern data to be described later. Thus, a predetermined bit pattern is drawn on the resist coating by the electron beam 2.

Figure 2:
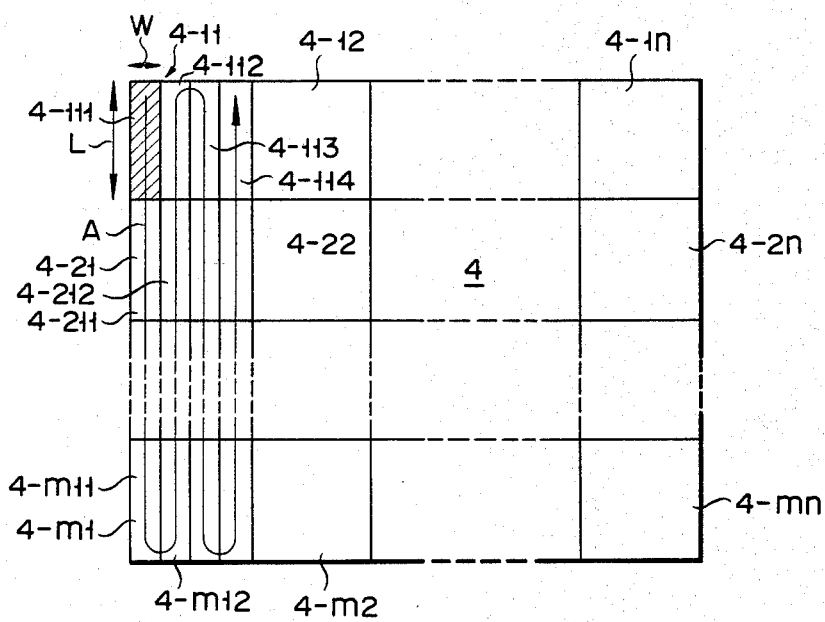
FIG. 2 is a view showing chip frames of chips formed on a semiconductor wafer placed on a sample stage shown in FIG. 1.

The beam scan in this embodiment will be described in a greater detail with reference to FIG. 2. The semiconductor wafer 4 consists of a plurality of semiconductor chips 4-11, 4-12, ..., 4-1n, 4-21, 4-22, ..., 4-2n, ..., 4-m1, 4-m2, ..., 4-mn arranged in x- and y-directions. Each chip consists of a plurality of chip frames each having a width W determined by the x-direction deflection width caused by the electron beam 2 and a length L, same as the length of the chip, in the y-direction of movement of the stage 3. For example, the chip 4-11 of FIG. 2 consists of four chip frames 4-111 to 4-114, with only the chip frame 4-111 shown shaded. All the other chips also each consist of four chip frames. If the scanning by the electron beam 2 starts, for instance, with the first chip frame 4-111 in the chip 4-11 in the direction of the length L thereof, it proceeds in the direction of arrow A through the successive chip frames 4-111, 4-211, ..., 4-m11 and then makes a U-turn to scan the successive chip frames 4-m12, ..., 4-212, 4-112, thereby covering a scan region in the direction of the width W. In this case the stage 3 is moved in the opposite direction. While it has been assumed that each chip consists of four chip frames for the sake of the simplicity, actually each chip as the dimensions of 8 mm by 8 mm, and since the width W is 256$\mu$, it will be understood that one chip actually consists of a very great number of chip frames. In practice, blank areas of the wafer 4 other than the area enclosed with the rectangle shown in FIG. 1 may be used to obtain as many chips as possible.

Each chip frame consists of a plurality of stripe regions, each of which has the same length L as the chip frame in the y-direction of movement of the stage 3 while having a width equal to the division of the chip frame width W by the number equal to the number of the stripe regions in the chip frame in the x-direction of deflection of the electron beam 2 perpendicular to the y-direction. In this embodiment, bit pattern data is received from an external memory for each stripe region and subjected to compression and expansion processes. The bit pattern data of the chip frame 4-111 shown in FIG. 2 may, for instance, be of the content as shown in FIG. 3.

Figure 3:
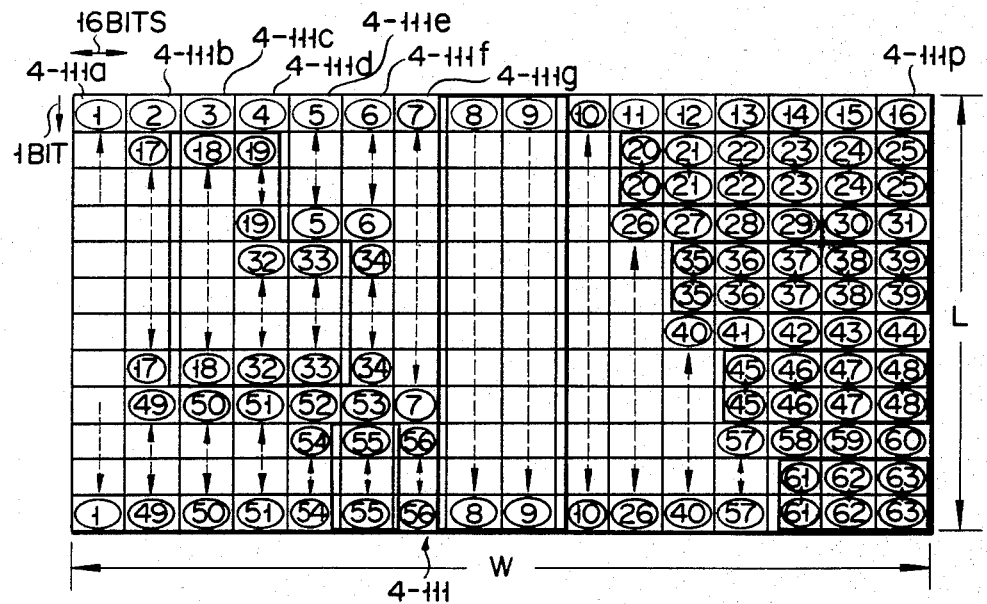
FIG. 3 is a view showing bit pattern data for one chip frame supplied to the embodiment of the system shown in FIG. 1.

In FIG. 3, since in this embodiment the width W of the chip frame 4-111 is 256$\mu$ while the diameter of the electron beam 2 is 1.0$\mu$, the number of bits of the bit pattern data in the direction of the width W is 256. In the example of FIG. 3, these 256 bits are uniformly divided into 16 portions, that is, the width of the individual stripe regions 4-111a, 4-111b, ..., 4-111p is set to 16 bits. On the other hand, since the length of each stripe region is equal to the length L of the chip 4-11, if the length of the chip 4-11 is 8 mm, 8,000 bits are provided as the pattern bits by the beam dot with the diameter of 1.0$\mu$. In FIG. 3, however, the number of bits in the direction of the length L is set to 12 to facilitate the understanding. In FIG. 3, portions enclosed by bold lines are areas where pattern data are present. Also, the numerals enclosed in circles indicate the order number of generation of bit pattern data with 16 bits as one unit in the direction of the electron beam scanning and also the content of the bit pattern data in each stripe region. For example, in the first stripe region 4-111a the first data is ①, and the same data prevails over the entire stripe region 4-111a.

In the embodiment of FIG. 1, the bit pattern data in the form as shown in FIG. 3 is stored in an external memory unit 8 and is progressively read out under the control of a microprocessor 9 to be transferred through a system bus 20 to a data compression unit 10 for data compression there. The compressed bit pattern data is temporarily stored in a memory unit 30. The stored data in the memory unit 30 is read out under the control of the microprocessor 9 to be transferred to a data expansion unit 80 where it is re-converted to the original bit pattern data, which is transferred through system bus 20 to the electron beam on-off control device 7. The operation of the stage driving device 5, electron beam deflecting device 6, and electron beam on-off control device 7 is controlled by a minicomputer 9a coupled to the system bus 20.

FIG. 4 shows the compressed bit pattern data for one frame stored in the memory unit 30. Here, the numerals in the circles correspond to the numerals of the bit pattern data in FIG. 3, and a subscript c attached after the circle means that the same data appears more than once in the same stripe region. In this case, the number of repetitions is expressed by the count of a repetition number counter. This count is referred to as count data and is stored immediately after a pattern data that is repeated more than once.

The memory unit 30, as shown in FIGS. 4 and 5, consists of eight memory modules 71 to 78 which are arranged in the mentioned order in the direction of the electron beam scanning. The memory modules 71 to 78 each has 13 memory addresses A0 to A12. For example, the first data in the first stripe region 4-111a, which is ①, is stored in the memory address A0 of the first memory module 71 in FIG. 4. Since the remaining data including the next data in the region 4-111a are also ①, the data ① and the repetition number count data c are both stored in the memory address A0 of the memory module 72. The repetition number of the count data c in this case is 11. In the stripe region 4-111b, the first data is ②, and this data alone is in ② the region 4-111b. Thus, the data ② is stored in the leading memory address A0 of the third memory module 73. Likewise, since the first data in the regions 4-111c and 4-111d are respectively ③ and ④ and since there is no repetition data, these data ③ and ④ are stored in the leading memory address A0 of the respective memory modules 74 and 75. In the region 4-111e there are four data ⑤, so that data ⑤ and data ⑤c are stored in the leading memory address A0 of the respective memory modules 76 and 77. In the region 4-111f four successive data ⑥ are present, so that data ⑥ is stored in the leading address A0 of the memory module 78, while data ⑥c is stored in the second address A1 of the memory module 71. In this way, the data ① to ㊏ in the stripe regions 4-111a to 4-111p are successively read out and subjected to data compression in the data compression unit 10, and the compressed data is stored in the memory bank consisting of the memory modules 71 to 78. As has been shown, the data compression unit 10 has a function of writing, at the time of storing the compression stripe data in the memory bank, all the compressed stripe data constituting the chip frame 4-111 in a state capable of being made high speed sequential access to at the time of the read out without need of dividing the memory bank into portions corresponding to the stripe regions 4-111a to 4-111p but by continuously using the address space covering all the memory areas.

FIG. 5 shows the internal construction of the memory unit 30 shown in FIG. 1. The data compression unit 10 is coupled to a memory management unit 40 in the memory unit 30 via the system bus 20, and the compressed bit pattern data obtained from the data compression unit 10 is transferred from the memory management unit 40 to a memory bus 50. The memory bus 50 is coupled to four memory module management units 60-1 to 60-4, and to each of the memory module management units 60-1 to 60-4 corresponding to two of the memory modules 71 to 78 are coupled. The memory control unit 40 directly controls read/write operation of the memory module management units 60-1 to 60-4 via the memory bus 50. At the time of the writing of the compressed data, the data is transferred to the memory module management units 60-1 to 60-4 and then sequentially written in the memory modules 71 to 78. At the time when reading out the compressed data and supplying it to the expansion unit 80, the compressed data read out from the memory modules 71 to 78 are transferred from the memory bus 50 through the memory control unit 40 and system bus 20 to the data expansion unit 80 under the control of the memory module management units 60-1 to 60-4. The compressed data transferred to the data expansion unit 80 is restored to the original bit pattern data to be transferred to the electron beam on-off control device 7 under the control of the microprocessor 9 shown in FIG. 1.

Figure 6:
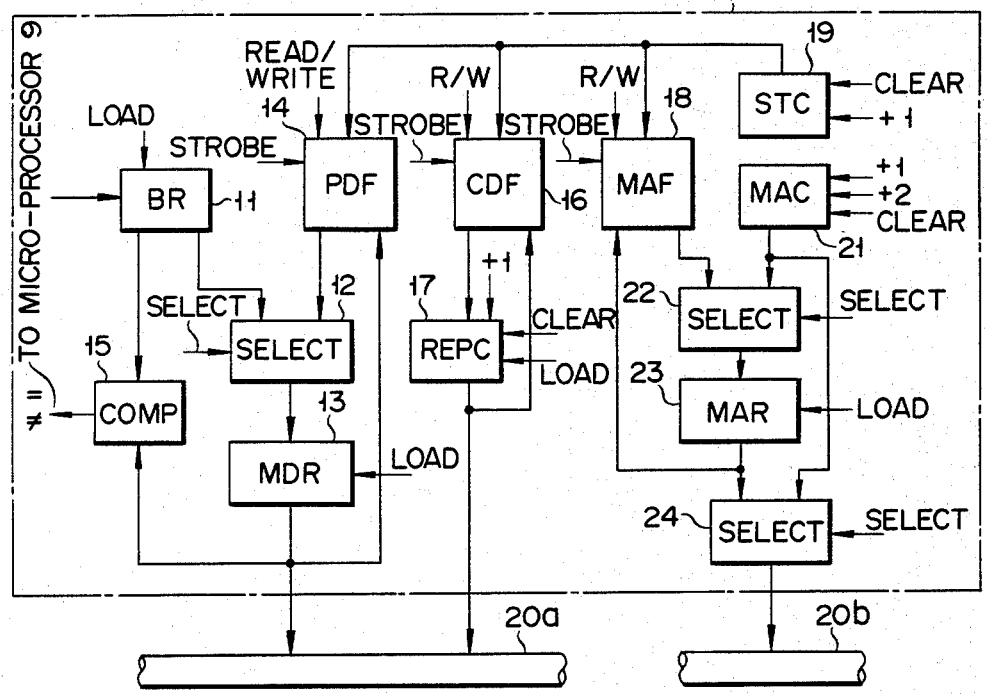
FIG. 6 is a detailed block diagram showing a data compression unit shown in FIG. 5.

Now, the construction and function of the individual units shown in FIG. 5 will be described. FIG. 6 shows the data compression unit 10. The bit pattern data read out from the external memory unit 8 under the control of the microprocessor 9 is transferred through the system bus 20 to a buffer register (BR) 11 in FIG. 6 and stored therein. The data stored in the BR 11 is fed through a selector 12 and a memory data register (MDR) 13 to a pattern data file 14, a comparator 15 and a system data bus 20a. The output of the pattern data file 14 is fed to the selector 12, and the selector 12 selectively supplies the output data of the BR 11 or pattern data file 14 according to a select signal (SELECT). The comparator 15 compares the data from the BR 11 and data from the MDR 13 and provides a coincidence or non-coincidence output to the microprocessor 9.

When a coincidence is detected in the comparator 15, a "+1" signal provided from the microprocessor 9 is supplied to a repeat counter (REPC) 17 for incrementing "+1". The content of the REPC 17 is fed to a count data 16 and a system data bus 20a, and the memory content of the count data file 16 is fed to a REPC 17.

Where the chip frame 4-111 consists of a plurality of stripe regions such as 16 stripe regions 4-111a to 4-111p as shown in FIG. 3, the content of a stripe counter (STC) 19 indicates the order number of the stripe region, to which the current bit data belongs. The content of a memory address counter indicates the address of the memory modules 71 to 78 in the memory unit 30, and it is fed through a selector 22 to a memory address register (MAR) 23 and stored therein while it is also transmitted through a selector 24 to a system address bus 20b. The content of the MAR 23 is fed to the memory address file 18 and stored therein, while it is also fed through the selector 24 to the system address bus 20b.

The pattern data file 14, count data file 16 and memory address file 18 in FIG. 6 each consist of, for instance, a random access memory, and their operation is controlled by a strobe signal (STROBE) and a read/write control signal (R/W) from the microprocessor 9. The access operation is effected by the STC 19. Likewise, the BR 11, MDR 13, REPC 17 and MAR 23 are controlled to receive data when a load signal (LOAD) is supplied. The selectors 12, 22 and 24 selectively select their input in response to the select signal (SELECT). The content of the REPC 17, STC 19 and MAC 21 is incremented by "+1" or "+2" when a "+1" or "+2" signal is supplied, and it is cleared to "0" when a clear signal (CLEAR) is supplied. The above operations are all controlled from the microprocessor 9 through the system bus 20.

Where one chip frame consists of 16 stripe regions, the pattern data is stacked in the pattern data file 14 through the route consisting of the selector 12 and MDR 13 until pattern data for the first 16 stripes is stacked in the file 14. The pattern data transferred from the external memory 8 to the BR 11 is held therein and compared to the pattern data having the same stripe No. read out from the pattern data file 14 in the comparator 15. When the compared data in the comparator 15 do not coincide, the output of the MDR 13 is provided to the system data bus 20a. If at this time the pattern data is accompanied by the count data c, the content of the REPC 17 is provided to the system data bus 20a after the pattern data. In the memory address file 18, the write address in the memory bank for each stripe is stored. The content of the MAC 21 is incremented by 1 with the generation of each new pattern data (or by 2 in case of a pattern data with count data c). This value is supplied through the selector 22 to the MAR 23 and set therein. When a coincidence is detected in the comparator 15, it is written in the memory address file 18 without changing the content thereof. This data is set in the MAR 23 through the selector 22 when the relevant stripe region is selected. When the comparator 15 detects a non-coincidence in the subsequent comparison of pattern data, the content of the MAR 23 is provided to the system address bus 20b. In the case of the pattern data which is not repeated, the content of the MAC 21 is provided to the system address bus 20b through the selector 24 just when the pattern data is sent via the system data bus 20a. When the data compression for one chip frame is completed, the content that has been preset in the comparator 15 at the time of the start is changed to "0", thus providing chip end data to the system data bus 20a. This chip end data is used to indicate the end of the chip data, and it is fed from the data compression unit to the memory unit 30 or from the memory unit 30 to the data expansion unit 80.

Figure 7:
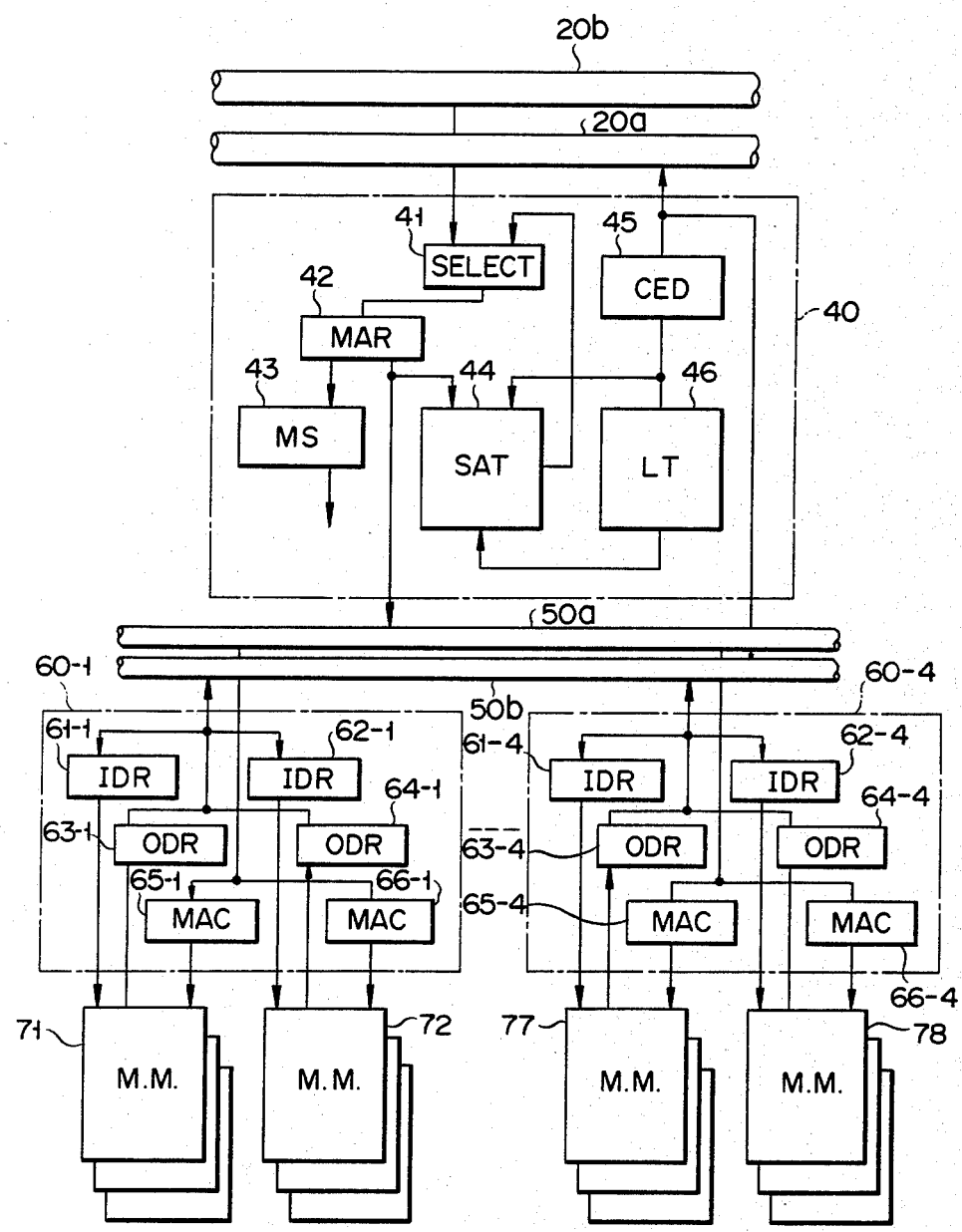
FIG. 7 is a further detailed block diagram showing the data compression unit shown in FIG. 5.

FIG. 7 shows the construction of the memory unit 30. The memory address data transferred via the system address bus 20 to the data compression unit 10 is fed through a selector 41 in the memory control unit 40 to a memory address register (MAR) 42 and stored therein. Part of the address data is taken into a module selector (MS) 43, and the output of the MS 43 selects one of the eight memory modules 71 to 78. In the selected memory module, the data of the memory address 50a is held in memory address counters (MAC) 65-1, 66-1, to 65-4, 66-4 of the memory module management units 60-1 to 60-4. Meanwhile, the compression bit pattern data transferred through the system data bus 20a is taken into one of the input data registers (IDR) 61-1, 62-1, ..., 61-4, 62-4 specified by the MS signal, and with a subsequent memory start signal the memory access operation for writing is started to effect writing of data in one of the memory modules 71 to 78.

The output of the MAR 42 is also fed to the start address table (SAT) 44, and this address is registered in the SAT 44 in case when the first data of a new chip is transferred via the system data bus 20a. A chip end detector 45 detects the end of chip data from the content and order of the data transferred via the system data bus 20a. The registration of address in the SAT 44 is effected with respect to the address of the first data supplied immediately after the detection of the chip end by the chip end detector 45.

When reading out the compressed data, data read into the output data registers (ODR) 63-1, 64-1, to 63-4, 64-4 are sequentially fed to the memory data bus 50b and transferred through the system data bus 20a to the data expansion unit 80. Again in this case, when a chip end is detected by the chip end detector 45, memory address is read out from a lay-out table (LT) 46 and is fed through a selector 41 and a MAR 42 to the memory address bus 50a to be set in the MACs 65-1, 66-1, to 65-4 to 66-4. Memory data is thus read out from the memory modules 71 to 78 specified by MACs 65-1, 66-1, to 65-4, 66-4 and latched in the ODRs 63-1, 64-1, to 63-4, 64-4.

The latched data are output to the data bus in the order specified by the output of the module selector 43. The module selector (MS) 43 receives the data of the MAR 42 which is incremented by 1 every time one word data is transferred to the data bus. That is, whenever, data of one of the ODRs 63-1, 64-1, to 63-4, 64-4 is provided to the data bus 20a, the MAR 42 is incremented by 1, and the MS 43 progressively specifies the ODRs 63-1, 64-1, to 63-4, 64-4 that provide data to the data bus 20a.

The MACs 65-1, 66-1, to 65-4, 66-4 are incremented by 1 every time data is provided from the ODRs 63-1, 64-1, to 63-4, 64-4 to the data bus 20a, for independently effecting memory read-out operation with respect to the new address. With n modules which can independently control the renewal of the read address and start of the read-out, the cycle time of the whole memory bank can be reduced substantialy to 1/n.

The LT 46 is a table, in which are stored pointer data of the SAT 44 for storing the leading address of each of the chips 4-11 to 4-m1 when scanning the frames of a plurality of chips 4-11, 4-21, ..., 4-m1, for instance the frames 4-111, 4-211, ..., 4-m11. By permitting the pointer data to be externally written, for instance from the minicomputer 9a, various chips of different patterns may be formed on the semiconductor wafer 4 in a desired manner.

Figure 8:
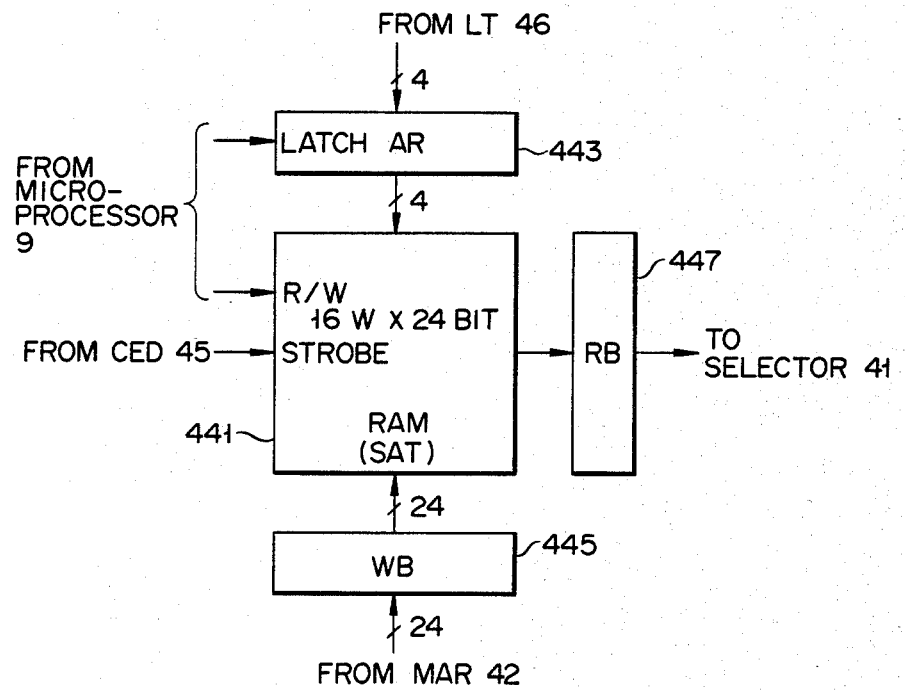
FIG. 8 is a block diagram showing a start address table shown in FIG. 7.

FIG. 8 is a block diagram showing a specific example of the SAT 44. The table itself is a random access memory (RAM) 441 having a construction of 16 W by 24 bits. The pointer data from the LT 46 is supplied to a 4-bit counter 443. Meanwhile, memory address data to be stored in the RAM 441, which consists of 24 bits, is fed from the MAR 42 to a writing buffer (WB) 445 and then fed to the RAM 441 and stored therein. The read-/write (R/W) control signal is supplied from the microprocessor 9 and a strobe signal is supplied from the CED 45 to the RAM 441. At the time of the read-out, a read signal is supplied to the R/W terminal, and data is provided to a reading buffer (RB) 447 of 24 bits. The memory address data stored in the RB 447 is then sent forth to the selector 41.

Figure 9:
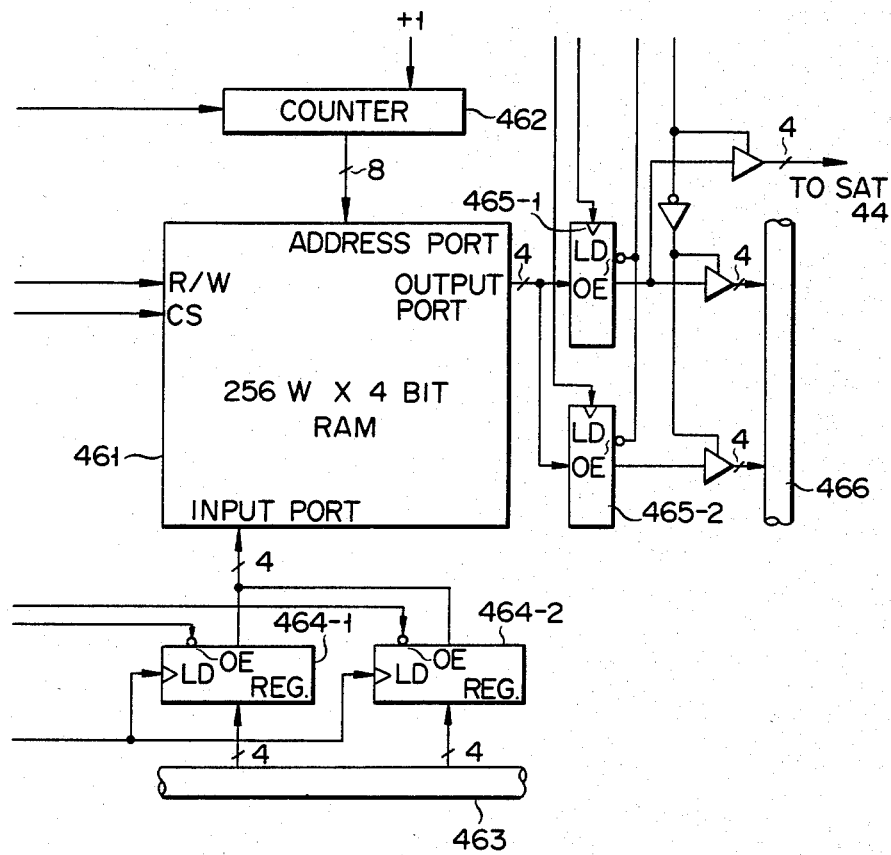
FIG. 9 is a block diagram showing a lay-out table shown in FIG. 7.

FIG. 9 shows a specific example of the LT 46. The table itself is a RAM 461 having a construction of 256 W by 4 bits. To its address port an 8-bit address data is supplied from an 8-bit counter 462, and to its input port a 4-bit pointer data from the minicomputer 9a is supplied from a minicomputer output bus 463 through two write registers 464-1 and 464-2. From its output port, the stored pointer data is read out through read registers 465-1 and 465-2 and provided to the SAT 44 or to a minicomputer input bus 466.

Now, the operation, in which the bit pattern data is compressed in the data compression unit 10 and stored in the memory unit 30, will be described with reference to FIGS. 10A, 10B and 10C. Here, the data of the frame 4-111 is taken as typical data.

Figure 10A:
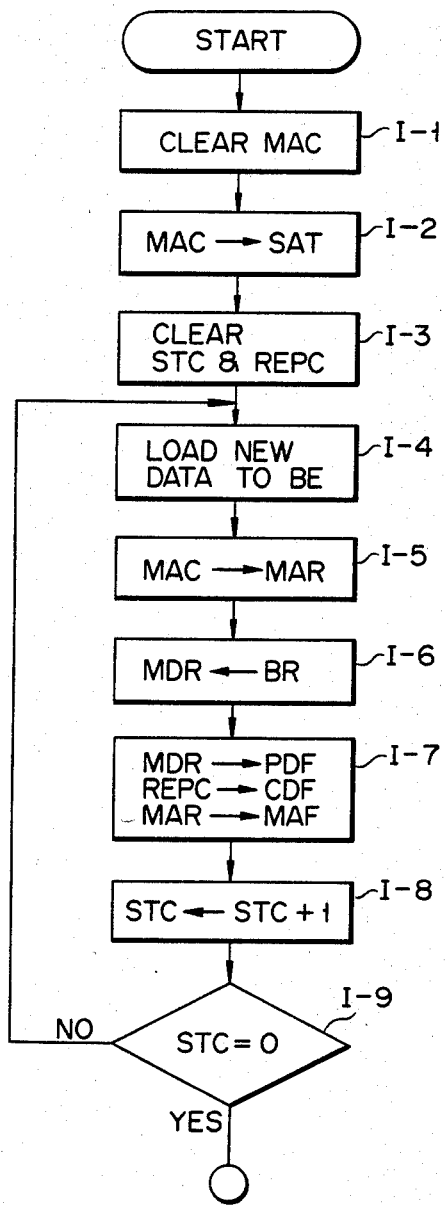
FIGS. 10A to 10C are flow charts illustrating the manner in which compressed bit pattern data from the data compressing unit is stored in the memory unit.

FIG. 10A shows the data processing of the first line of frame. In a step I-1, the MAC 21 is cleared to "0". In the next step I-2, the content of the MAC 21 is written in the SAT 44 shown in FIG. 7. Then, in a step I-3 the contents of the STC 19 and REPC 17 are cleared to "0". In a subsequent step I-4, new data is loaded in the BR 11. In a subsequent step I-5 the content of the MAC 21 is written in the MAR 23. In a subsequent step I-6, the data of the BR 11 is loaded into the MDR 131. Thereafter, in a step I-7 the content of the MDR 13 is loaded into the pattern data file 14, while the content of the REPC 17 is loaded into the count data file 16 and the content of the MAR 23 is loaded into the memory address file 18. In a subsequent step I-8, the STC 19 is incremented by 1, and in the next step I-9 whether the content of the STC 19 is "0" is checked. The STC 19 is a cyclic counter, the content of which cyclically changes in the order of 0, 1, 2, ..., 15, 0, 1, 2, .... When the content becomes 0, i.e., a YES yields in the step I-9, indicating that the processing of the first line, i.e., 16 stripes, is ended, a subsequent step II-1 (FIG. 10B) is executed. If the content is not 0, indicating that the processing for the first line has not yet been ended, the routine returns to the step I-4.

Figure 10B:
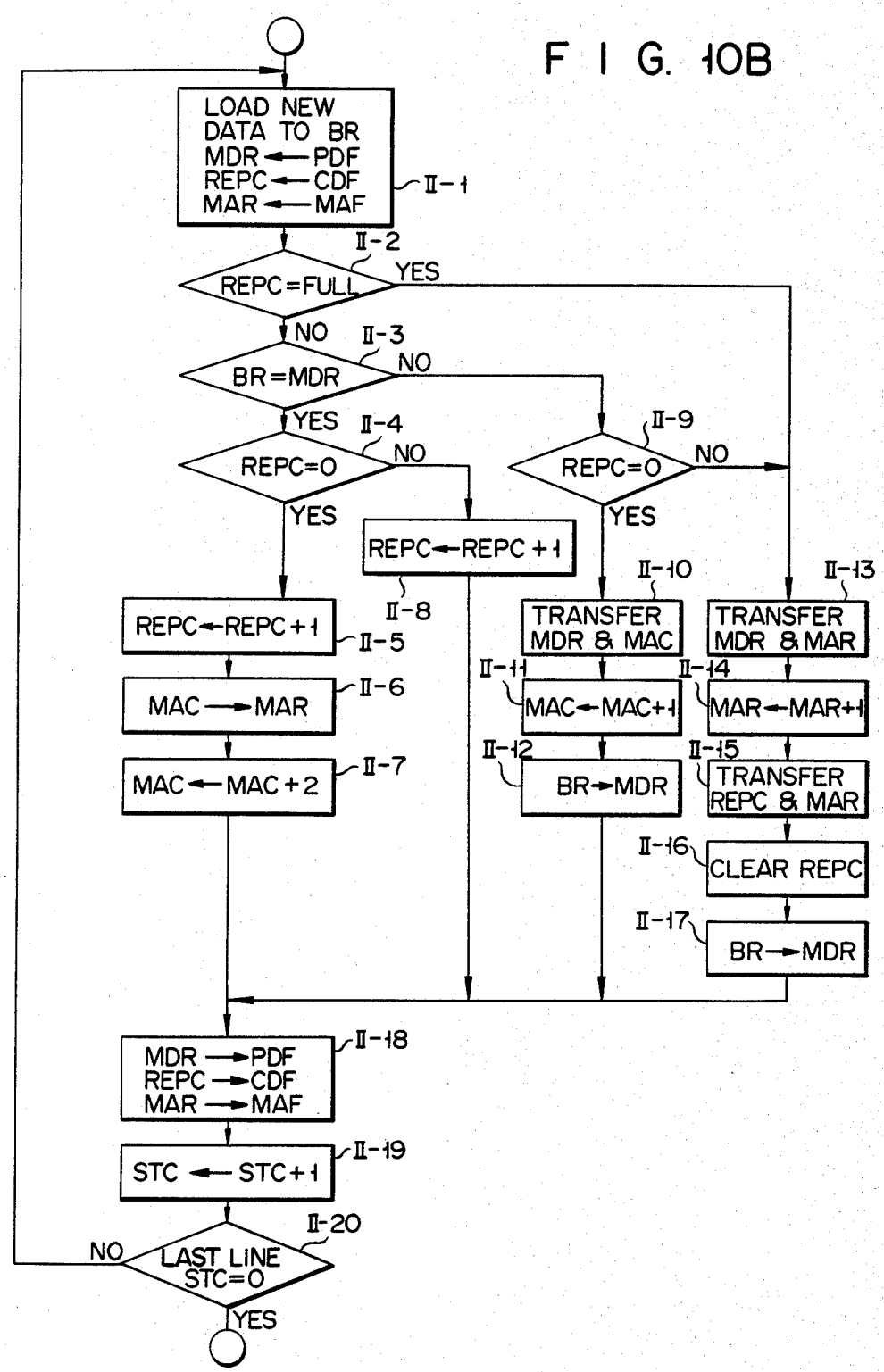

FIG. 10B shows the flow for the processing for the second and following lines. In the step II-1, new data is loaded in the BR 11, while also the data of the pattern data file 14 is transferred to the MDR 13, the data of the count data file 16 is transferred to the REPC 17 and the address data of the memory address file 18 is transferred to the MAR 23. When these operations are ended, a step II-2 is executed, in which whether the content of the REPC 17 is FULL is checked. The REPC 17 is a hexadecimal counter, and if its content is not 16, a step II-3 is executed, in which whether the content of the BR 11 and the content of the MDR 13 are the same is checked. If these contents are the same, a step II-4 is executed, in which whether the content of the REPC 17 is 0 is checked. If the content is 0, a step II-5 is executed, in which the REPC 17 is incremented by 1. Then, in a step II-6 the content of the MAC 21 is loaded into the MAR 23. Then in a subsequent step II-7, the MAC 21 is incremented by 2, which means two words as the pattern data and count data.

If it is detected in the step II-4 that the content of the REPC 17 is not 0, a step II-8 is executed, in which the REPC 17 is incremented by 1.

If it is detected in the step II-3 that the content of the MR 11 and the content of the MDR 13 do not coincide, a step II-9 is executed, in which whether the content of the REPC 17 is 0 is checked. If it is 0, a step II-10 is executed, in which the contents of the MDR 13 and MAC 21 are transferred through the system data bus 20a and through the system address bus 20b, respectively to the memory unit 30. Then, in a step II-11 the MAC 21 is incremented by 1, and in a step II-12 the content of the BR 11 is loaded into the MDR 13.

If it is detected in the step II-2 that the content of the REPC 17 is FULL or if it is detected in the step II-9 that the content of the REPC 17 is not 0, a step II-13 is executed, in which the contents of the MDR 13 and MAR 23 are transferred to the memory 30. Then, in a step II-14 the content of the MAR 23 is incremented by one, and is a step II-15, the contents of the REPC 17 and MAR 23 are transferred. When the transfer is ended, a step II-16 is executed, in which the REPC 17 is cleared to 0, and in a subsequent step II-17 the content of the BR 11 is loaded into the MDR 13.

After the steps II-7, II-8, II-12 and II-17, a step II-18 is executed, in which the contents of the MDR 13, REPC 17 and MAR 23 are transferred to the PDF 14, CDF 16 and MAF 18. Then a step II-19 is executed, in which the STC 19 is incremented by 1. Then, in a subsequent step II-20 whether the process is in the last line of the chip and whether the content of the STC 19 is zero are checked. If it is detected that the process is in the last line and the content of the STC 19 is zero, a subsequent step III-1 (FIG. 10C) is executed. If it is detected that the process is not in the last line and that the content of the STC 19 is not zero, the routine goes back to the step II-1.

Figure 10C:
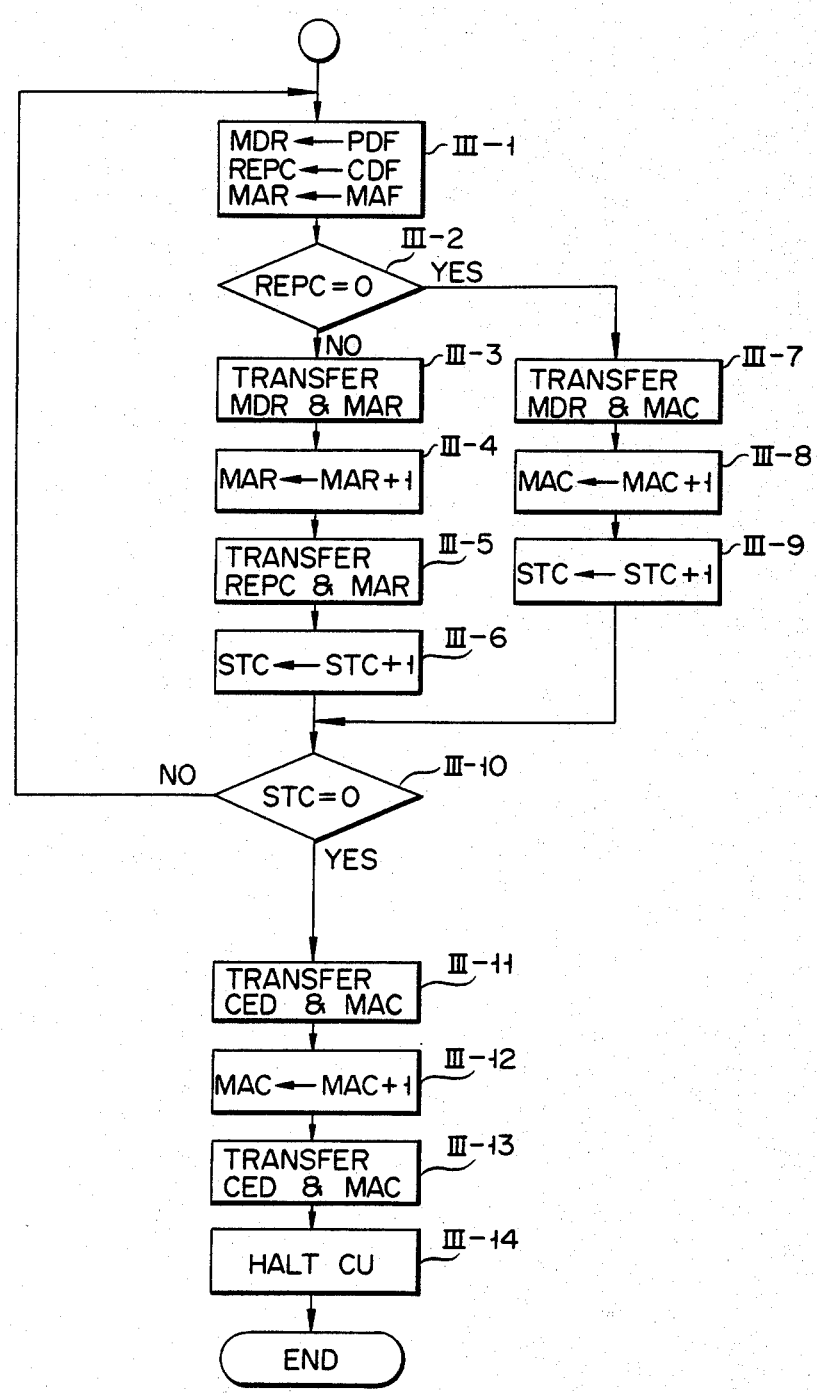

FIG. 10C shows the flow of processing with respect to the last stripe in the last line. In the step III-1, the contents of the PDF 14, CDF 16 and MAF 18 are transferred to the MDR 13, REPC 17 and MAR 23 respectively. Then, a step III-2 is executed, in which whether the content of the REPC 17 is zero is checked.

If the content of the REPC 17 is other than 0, a step III-3 is executed, in which the contents of the MDR 13 and MAR 23 are transferred to the memory unit 30. Then, a step III-4 is executed, in which the content of the MAR 23 is incremented by 1. In a subsequent step III-5, the contents of the REPC 17 and MAR 23 are transferred to the memory unit 30. In a subsequent step III-6, the content of the STC 19 is incremented by 1.

If it is detected in the step III-2 that the content of the REPC 17 is 0, a step III-7 is executed, in which the contents of the MDR 13 and MAC 21 are transferred to the memory unit 30. In a subsequent step III-8, the content of the MAC 21 is incremented by 1, and in a step III-9 the content of the STC 19 is further incremented by 1.

After the steps III-6 and III-9, a step III-10 is executed, in which the content of the STC 19 is checked. If it is detected in the step III-10 that the content of the STC 19 is not 0, the routine goes back to the step III-1. If it is detected in the step III-10 that the content of the STC 19 is 0, a step III-11 is executed in which the contents of the CED 15 and MAC 21 are transferred to the system data bus. Then, a step III-12 is executed, in which the content of the MAC 21 is incremented by 1. Then a step III-13 is executed, in which the contents of the CED 45 and MAC 21 are transferred. Then a step III-14 is executed to halt the CU operation, thus brining an end to the data compression and storage process for one frame.

Figure 11:
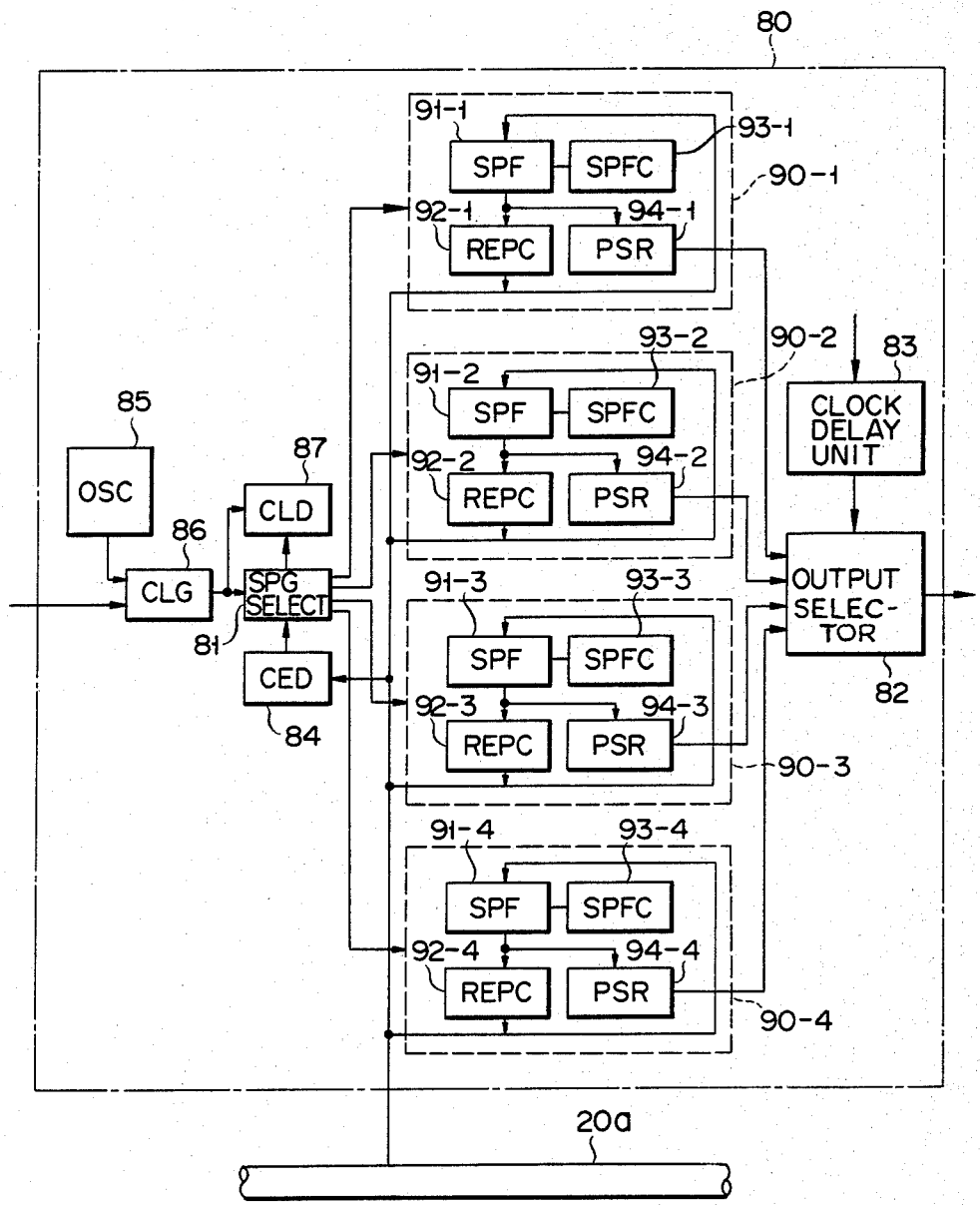
FIG. 11 is a block diagram showing a data expansion unit shown in FIG. 1.

FIG. 11 shows the construction of the expansion unit 80. The compressed bit pattern data that has been transferred via the system data bus 20a, are transferred to stripe pattern files (SPF) 91-1 to 91-4 in the stripe pattern generators (SPG) 90-1 to 90-4. The outputs of the SPFs 91-1 to 91-4 are fed to repeat counters (REPC) 92-1 to 92-4, stripe pattern file counters (SPFC) 93-1 to 93-4 and pattern shift registers (PSR) 94-1 to 94-4. The transferred data is written as a pair consisting of pattern data and count data in the SPFs 91-1 to 91-4. In the SPGs 90-1 to 90-4, pattern data is read out from the SPFs 91-1 to 91-4 and loaded into the PSRs 94-1 to 94-4, and the count data read out is loaded into the REPCs 92-1 to 92-4. The SPGs 90-1 to 90-4 are selected according to the output of the SPG selector 81 which is driven by an oscillator (OSC) 85, a clock gate (CLG) 86 and a clock distributor (CLD) 87. If the SPG 90-1, for instance, is selected, the PSR 94-1 starts data shifting, and decrements the REPC 92-1 after the completion of shift for one stripe. Thus, when the preset content of the REPC 92-1 becomes 0, indicating that the pattern data has been used a prescribed number of times, the stripe pattern data sends out a data transfer request to the memory unit 30 via the system bus 20. For one transfer request, the memory unit 30 first transfers the first data word (pattern data). It also checks the control bit of the pattern data, and if it decides that the data is accompanied by the second word data (count data), it transfers this data to the data bus 20a. If it decides in the check of the first data word that the data is not accompanied by the second data word, no second word data is transferred. In the SPGs 90-2 to 90-4, similar check of the control bit of data is effected, and 2-word data is taken if the checked data is accompanied by count data. If the data is not accompanied by any count data, a count data of the content indicating that there is no repetition is formed clearing the REPCs 92-1 to 92-4 to zeros, and this data is written in the SPFs 91-1 to 91-4.

More particularly, the check of control bit is effected concurrently with the writing of data, which has been transferred from the memory unit 30 via the system data bus 20a, as pattern data in the SPFs 91-1 to 91-4, and when it is decided that the data is not accompanied by count data, the SPGs 90-1 to 90-4 are caused to produce count data zero valued which afterward is written in the SPFs 91-1 to 91-4 just in the same way count data sent from the memory unit 30 is written.

In the individual SPGs 90-1 to 90-4, the operations of sending out a data transfer request to the memory unit 30, writing of data having been transferred via the system data bus 20a in the SPFs 91-1 to 91-4, checking of the control bit and subsequent dealing with the second word data, loading pattern data from the SPFs 91-1 to 91-4 into the PSRs 94-1 to 94-4, loading count data in the REPCs 92-1 to 92-4, shifting out data from the PSRs 94-1 and 94-4 and decrementing the repeat count value by 1 for every shift-out, and checking the REPCs 92-1 to 92-4 and writing the count value in the SPFs 91-1 to 91-4 when there is a remaining repetition number. These operations are effected substantially concurrently, for instance by adopting phase variation among the SPGs 90-1 to 90-4.

The outputs of the SPGs 90-1 to 90-4 in FIG. 11 are supplied as output from the PSRs 94-1 to 94-4 to an output data selector 82, which is driven by an output clock of a clock delay unit 83. In other words, the shift data outputs of the PSRs 94-1 to 94-4 are switched by the output data selector 82 as they are transferred to the electron beam on-off control device 7 shown in FIG. 1. The output of SPG selector 81 is delayed by one block according to the output of the clock delay unit 83 for latching the output signal from the output data selector 82, thus preventing instable operation at the time of the data switching in the output data selector 82.

The data from the data bus 20a is also fed to a chip end detector (CED) 84, and when a chip end is detected there, a detection signal is supplied to the SPG selector 81 to interrupt the operation of the data expansion unit 80.

Figure 12:
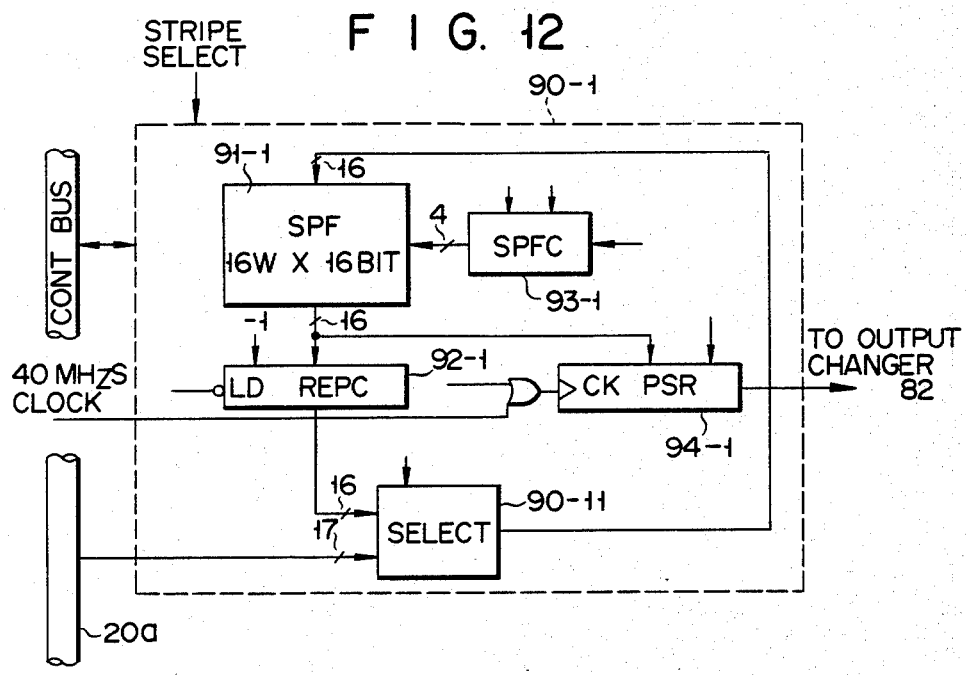
FIG. 12 is a block diagram showing a stripe pattern generator shown in FIG. 11.

FIG. 12 is a block diagram showing a specific example of the SPG shown in FIG. 11. Here, the SPG 90-1 is taken. An SPF 91-1 is a RAM having a construction of 6 W by 16 bits, and its address data is given as 4-bit data from a SPFC 93-1. The pattern data and count data from the SPF 91-1 are given as 16-bit data to PSR 94-1 and REPC 92-1, respectively. The output of the REPC 92-1 and data from the bus 20a are fed to a selector 90-11, and the selected data is transferred to the SPF 91-1. The output data of the PSR 94-1 is supplied to the output data selector 82.

Figure 13:
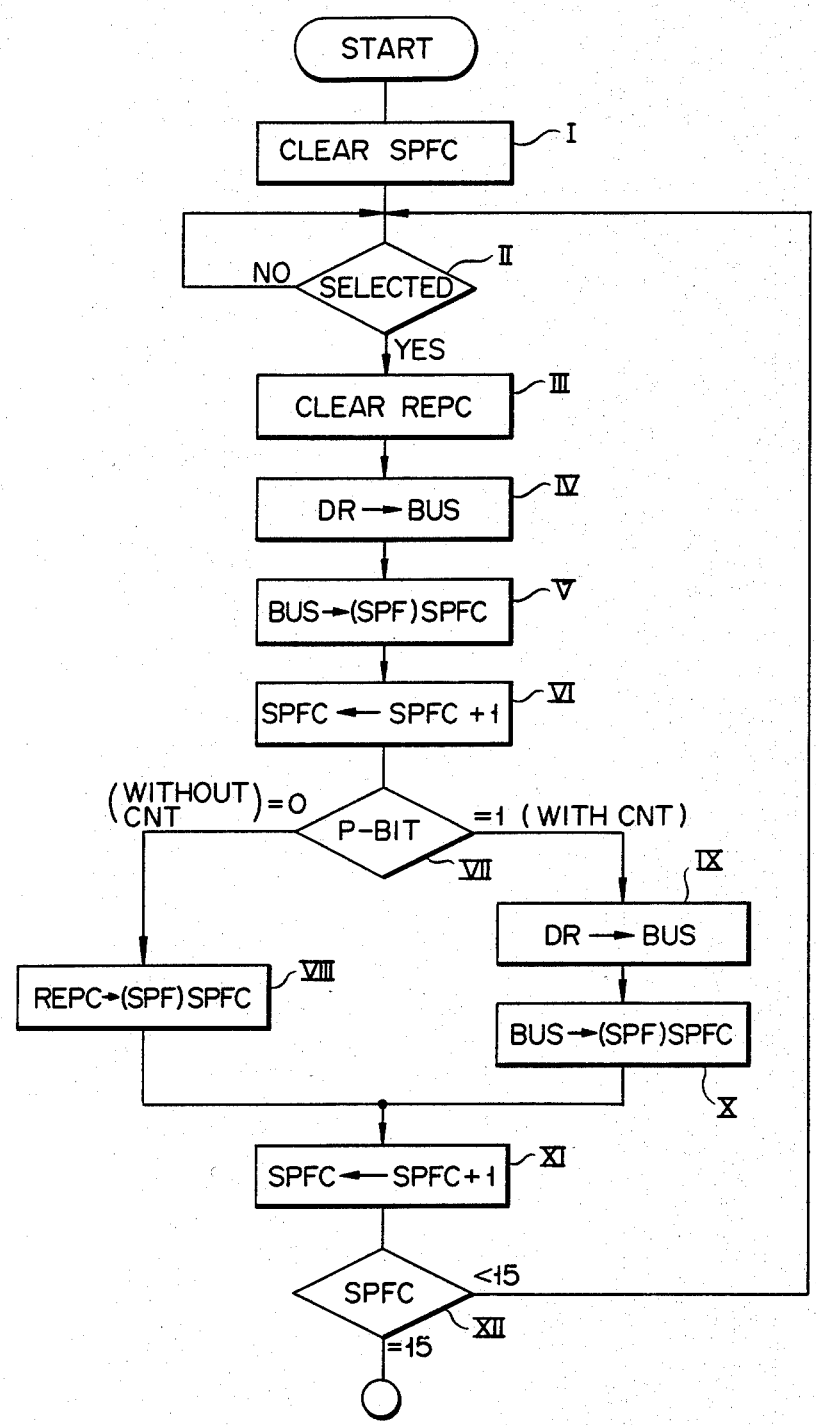
FIGS. 13 and 14 are flow charts illustrating the operation of the circuits shown in FIGS. 11 and 12.

Now, the operation of the SPGs 90-1 to 90-4 (here the SPG 90-1 with reference to FIGS. 11 and 12) will be described with reference to FIGS. 11 and 12. Referring first to FIG. 13, immediately after the start the SPFC 93-1 is cleared in a step I. In a subsequent step II, whether the SPG 90-1 is selected is checked. If the answer is NO, the routine goes back to the step II, while if the answer is YES a step III is executed. In the step III the REPC 92-1 is cleared. Then a step IV is executed, in which the content of the output data register (DR) in the memory unit 30 is provided to the system data bus 20a. Then, a step V is executed, in which the compressed pattern data provided to the system data bus 20a is transferred to the SPF 91-1, and is also set in the SPFC 93-1. Then, a step VI is executed, in which the content of the SPFC 93-1 is incremented by 1.

In a subsequent step VII, the control bit in the pattern data is checked. If there is no count data, i.e., if the control bit is "0", a step VIII is executed. If there is count data, i.e., if the control bit is "1", a step IX is executed. In the step VIII, a count data indicating that there is no repetition of pattern data is formed using the REPC 92-1, and this data is written in the SPF 91-1. If the pattern data is accompanied by count data, the content of the data register (DR) is provided to the system data bus 20a in the step IX. In a subsequent step X, the pattern data and count data provided from the memory unit 30 are registered from the system data bus 20a into the SPF 91-1.

After the step VIII or X is ended, a step XI is executed, in which the content of the SPFC 93-1 is incremented by 1. Then, a step XII is executed, in which whether the content of the SPFC 93-1 is 15 is checked. If the content is 15, the routine is ended. If it is less than 15, the routine goes back to the step II for repeating the operation as described.

Figure 14:
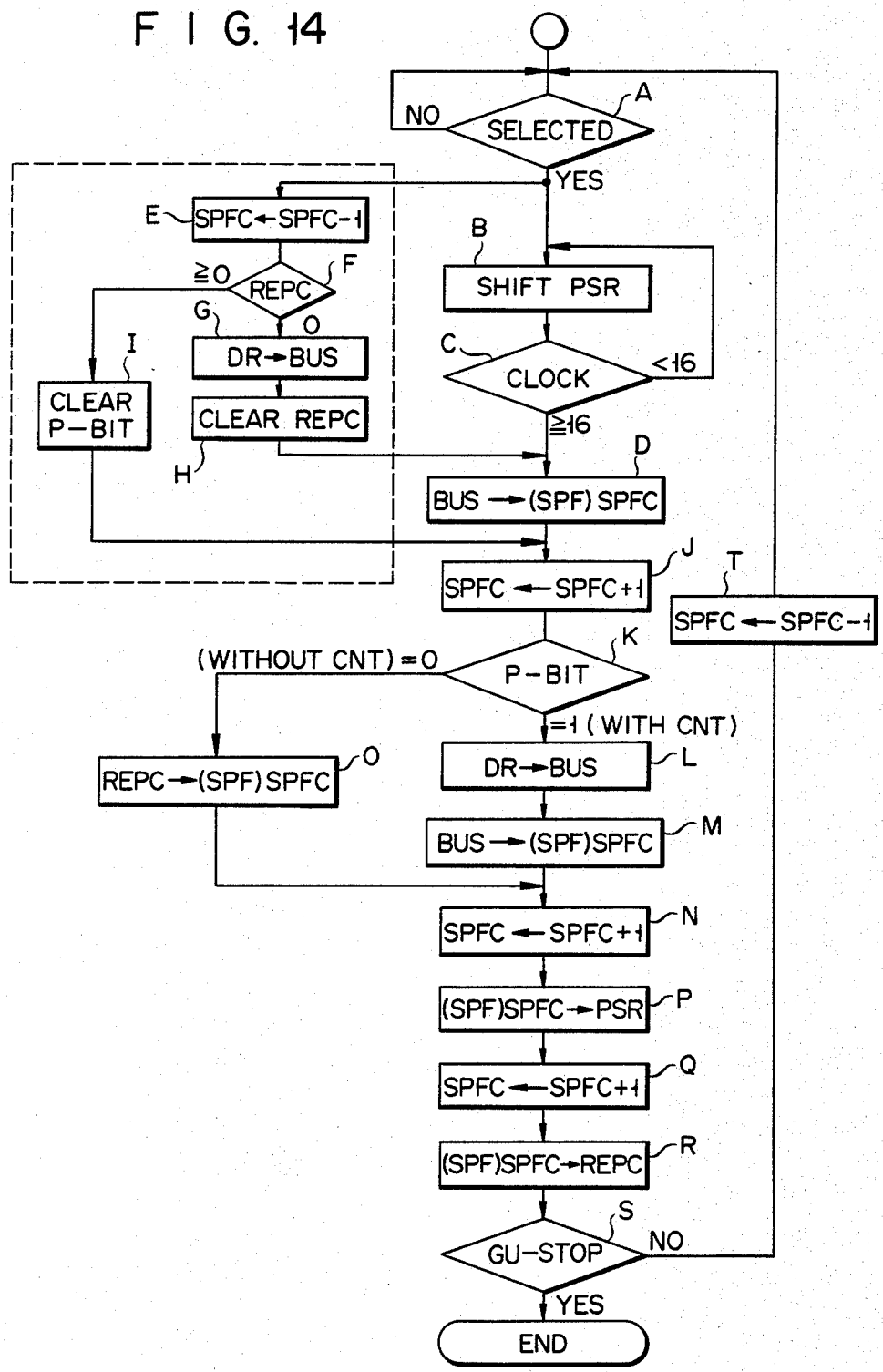

The flow chart of FIG. 13 represents the operation immediately after a GU-GO (generator unit-go) command, and the operation after sync is as shown in the flow chart of FIG. 14. The GU-GO command is a one for starting the operation of the stripe pattern generators (SPGs) 90-1 to 90-4. Here, whether the SPG 90-1 is selected is checked in a step A. If it is detected that the SPG 90-1 is selected, a step B is executed, in which the content of the PSR 94-1 is shifted. Then, in a step C, whether 16 clock pulses have been supplied is checked. If 16 has not yet been reached by the clock, the routine goes back to the step B. If it is detected that 16 or more clock pulses have been supplied, a step D is executed.

Meanwhile, a step E is also executed after the step A. In the step E, the content of the SPFC 93-1 is decremented by 1, and in a subsequent step F the content of the REPC 92-1 is checked. If the content preset in the REPC 92-1 is less than 0, a step G is executed, in which the content of the data register (DR) is provided to the system data bus 20a. Then, a step H is executed, in which the REPC 92-1 is cleared and the routine goes to the step D. If it is detected in the step F that the content of the REPC 92-1 is 0 or above, the check bit is cleared in a step I, and the routine goes to a step J.

In the step D, the data provided to the data bus 20a is loaded into the SPF 91-1, and then the step J is executed. In the step J, the content of the SPFC 93-1 is incremented by 1. In a subsequent step K, the control bit is checked. If the control bit is "1", indicating that there is count data, a step L is executed, in which the content of the data register (DR) in the memory unit 30 is transferred to the system data bus 20a. In a subsequent step M, two data words of the bus 20a are loaded into the SPF 91-1. In a subsequent step N, the content of the SPFC 93-1 is incremented by 1.

If it is detected in the step K that the control bit is "0", a step O is executed, in which the count data without repetition formed in the REPC 92-1 is written in the SPF 91-1, and then the step N is executed.

After the step N, a step P is executed, in which the content of the SPF 91-1 is transferred to the PSR 94-1. Then, in a step Q the content of the SPFC 93-1 is incremented by 1. In a subsequent step R, the content of the SPF 91-1 is transferred to the REPC 92-1. Then, a step S is executed, in which whether the output of the generator 90-1 is stopped is checked. If the answer is NO, the routine goes back to the first step A for repeating the operation described above. If the answer is YES, the routine is ended.

FIGS. 15 and 16 are timing charts illustrating the operation of the data expansion unit 80. In this example, one frame consisting of 256 bits is divided into 16 stripes as shown in FIG. 3, and 16 bits of one stripe are expanded in 400 nsec. and at 40 MHz. FIG. 15 shows the manner in which the SPGs 90-1 to 90-4 operate to stack the pattern data and count data for 16 stripes in the SPFs 91-1 to 91-4 immediately before the start of scanning of the first line of the frame. When one SPG, for instance the SPG 90-1, completes the writing of the pattern data and count data in the associated SPF 91-1 in 400 nsec., the next SPG 90-2 executes similar process in the next 400 nsec. In this way, the four SPGs 90-1 to 90-4 sequentially execute similar processes in a total period of 1,600 nsec. The total 16 stripes are written in the SPFs 91-1 to 91-4 in four periods, i.e., 6.4 μsec. In the last or fourth period, a cycle of loading the pattern data and count data read out from the SPFs 91-1 to 91-4 in the PSRs 94-1 to 94-4 and REPCs 92-1 to 92-4 is added.

FIG. 16 shows the manner, in which a pattern is drawn on a wafer by the electron beam, particularly in case when the switching between the N-th and (N+1)- th chips is effected. Here, the manner, in which a cycle of shifting data from the PSRs 94-1 to 94-4, a cycle of stacking data on the system data bus 20a in the SPFs 91-1 to 91-4 and a cycle of loading data from the SPFs 91-1 to 91-4 to the REPCs 92-1 to 92-4 are carried out in an interleaved fashion among the four SPGs 90-1 to 90-4.

As has been described in the foregoing, with the electron beam pattern generation system of this embodiment, each chip frame is divided into 16 stripe regions, and data compression is effected for each stripe in the data compression unit 10 to obtain compressed data for each stripe, which consists of pattern data representing information about the pattern and count data representing the number of repetitions of use of the pattern data. Also, all the compressed stripe data constituting one chip frame are stored in the form capable of being made high speed sequential access to at the time of the read-out in the memory unit 30 without need of dividing the memory modules 71 to 78 into portions for the respective stripes by continuously using the address space covering the entire memory areas. Further, of the aforementioned stored compressed data, the pattern data is developed in the data expansion unit into blanking data consisting of "1"s and "0"s for repeatedly on-off controlling the electron beam by a number represented by the count data.

Thus, it is possible to permit speed increase of a system, where pattern data of a dense data system representing rectangles or trapezoids is drawn while developing it into bit pattern with an exclusive processing unit in a pattern drawing device. Further, since all the stripe data constituting one chip frame are written without need of dividing the memory modules 71 to 78 into portions corresponding to the respective stripes but by continuously using the address space covering the entire memory areas, data can be stored in the individual memory modules 71 to 78 substantially to the same degree. Thus, it is possible to determine the memory capacity of the memory modules 71 to 78 without need of considering the fluctuations of data with the individual stripes but by merely considering the amount of data that results after compression of the frame data. Further, since the writing of data can be obtained without forming any space in the memories, a high efficiency of use of memory can be obtained. Further, there is no need of tuning of memory areas even if the data quantity after compression of the particular stripes is increased. Further, since the leading addresses for a plurality of chips can be stored in the start address table, it is possible to deal with different chips. Further, it is possible to effect drawing in a desired arrangement of data. Further, since parallel processing is adopted when expanding the compressed data, bit pattern formation at high speed data rate is possible. Further, since the frame is divided into stripes and the compression is effected by comparing the leading and trailing data, it is possible to obtain high efficiency compression.

Further, various changes and modifications of the above embodiment can be made. For example, the number of stripes obtained by dividing the chip frame is not limited to 16, but it may be suitably determined according to a given specification. Also, the number of memory modules is not limited to 8, but it may be suitably determined according to a given specification.

What is claimed is:

1. A charged beam pattern generating system for drawing a beam pattern on chip frames with a prescribed width and length defined on a sample, said system comprising:

a charged beam projection means for projecting a charged beam having a beam deflection means for deflecting the charged beam in the width direction of the chip frame;

a stage for carrying the sample continuously in the length direction of the chip frame;

means for on-off controlling the charged beam according to digital data with said digital data consisting of "1's" and "0's";

compressing means for compressing data obtained for individual stripe regions of each chip frame, said stripe regions having the same length as the chip frame in the direction of movement of said sample stage and having a width obtained by uniformly dividing the chip frame in the perpendicular direction;

means for storing into a memory bank, all of said compressed stripe data in a stage which is made into a high speed sequential access buffer at the time of reading out the stripe data without the need for dividing said memory bank into different high speed sequential access buffers for the individual stripes, by continuously using the address space covering all the memory areas of the memory bank; and data expansion means for expanding the stored compressed data into blanking data consisting of "1's" and "0's" for on-off control of said charged beam.

2. The electron beam pattern generation system according to claim 1, wherein said data compression means comprises a buffer register storing a unit pattern data being compressed, a pattern data file for storing a series of unit pattern data stored in the buffer register, a comparator for comparing a unit pattern data stored in the buffer register with a unit pattern data read out of the pattern data file and delivering a coincident signal, a repeat counter for counting the number of coincident signal, a count data file for storing the count of the repeat counter, and memory addressing means for forming a memory address of a unit pattern data at the time of detection of the coincidence at the comparator.

3. The electron beam pattern generation system according to claim 1, wherein said means for storing has a memory management unit including a start address table for storing a memory address of a first data of a chip, a chip end detector for detecting an end of a chip data, and a lay-out table for storing a memory address being read out in response to an output of the chip end detector.

4. The electron beam pattern generation system according to claim 3, wherein each of said memory module management units includes a pair of input data registers for storing a compressed pattern data sent forth from the data compression unit, the stored compressed data being transferred to memory modules selectively, a pair of memory address counters for designating the addresses of the memory modules, and a pair of output data registers for storing the compressed pattern data read out of the memory modules.

5. The electron beam pattern generation system according to claim 1, wherein said data expansion means includes a plurality of units arranged in a row and each having a function for storing pattern data and count data and a function for repeatedly shifting the pattern data at a high clock rate a number of times represented by the count data, and means for cyclically switching these units.

6. The electron beam pattern generation system according to claim 5, wherein said data expansion means comprises a plurality of stripe pattern generators each of which includes a stripe pattern file for storing a compressed bit pattern data and a count data transmitted through a system data bus from said memory unit, a repeat counter for storing the count data read out of the stripe pattern file, and a pattern shift register for storing the compressed bit pattern data read out of the stripe pattern file, a stripe pattern generator selector for selecting sequentially one of the stripe pattern generators, and an output data selector for selectively delivering expanded pattern data generated from a pattern shift register in a selected stripe pattern generator.

* * * * *